(12) United States Patent
Baba et al.

(10) Patent No.: US 8,471,710 B2
(45) Date of Patent: Jun. 25, 2013

(54) WIRELESS TAG AND METHOD OF PRODUCING WIRELESS TAG

(75) Inventors: Shunji Baba, Kawasaki (JP); Shigeru Hashimoto, Inagi (JP); Tsuyoshi Niwata, Inagi (JP); Satoru Nogami, Inagi (JP); Yoshiyasu Sugimura, Inagi (JP)

(73) Assignees: Fujitsu Limited, Kawasaki (JP); Fujitsu Frontech Limited, Inagi-shi, Tokyo (JP)

( * ) Notice: Subject to any disclaimer, the term of this patent is extended or adjusted under 35 U.S.C. 154(b) by 347 days.

(21) Appl. No.: 12/834,294

(22) Filed: Jul. 12, 2010

(65) Prior Publication Data

US 2011/0032100 A1    Feb. 10, 2011

(30) Foreign Application Priority Data

Aug. 6, 2009    (JP) ................................. 2009-183025

(51) Int. Cl.
*G08B 21/00*    (2006.01)

(52) U.S. Cl.
USPC .................. 340/572.7; 340/572.1; 340/572.8; 343/700 R; 343/873; 235/492

(58) Field of Classification Search
USPC .................. 340/572; 343/700 M, 700 R, 873, 343/702, 700 MS; 235/492; 257/679, 787
See application file for complete search history.

(56) References Cited

U.S. PATENT DOCUMENTS

| 2004/0245347 A1 | 12/2004 | Shibamoto et al. | |
| 2006/0118229 A1* | 6/2006 | Ohashi et al. | 156/60 |
| 2006/0131426 A1* | 6/2006 | Ishikawa et al. | 235/492 |
| 2006/0290514 A1* | 12/2006 | Sakama et al. | 340/572.7 |
| 2009/0130393 A1 | 5/2009 | Kobayashi et al. | |

FOREIGN PATENT DOCUMENTS

| CN | 1622126 A | 6/2005 |
| CN | 101441727 A | 5/2009 |
| EP | 2065841 A1 | 6/2009 |
| JP | 3044495 U | 12/1997 |
| JP | 2008-9537 A | 1/2008 |
| JP | 2009-129094 A | 6/2009 |

OTHER PUBLICATIONS

Chinese Office Action dated Jul. 4, 2012, issued in corresponding Chinese Patent Application No. 201010246351.2, (17 pages). With English Translation.
European Search Report dated Oct. 5, 2010, issued in corresponding European Patent Application No. 10170048.2.
Notice of Rejection dated Mar. 26, 2013, issued in corresponding Japanese Patent Application No. 2009-183025, with English translation (6 pages).

* cited by examiner

*Primary Examiner* — Mohammad Ghayour
*Assistant Examiner* — Mark Rushing
(74) *Attorney, Agent, or Firm* — Westerman, Hattori, Daniels & Adrian, LLP

(57) ABSTRACT

According to an aspect of the invention, a wireless tag includes a base member that is flexible and on a surface of which a wiring pattern is formed, a wireless circuit chip that is mounted on the base member and connected to the wiring pattern; protective members that cover the base member and the wireless circuit chip and are lower in hardness than the base member, and a plurality of spherical projections that are arranged on the surfaces of the protective members, higher in hardness than the base member, and so arranged as to interfere with other adjacent spherical projections when at least the protective members are bent beyond a predetermined angle.

16 Claims, 5 Drawing Sheets

WIRELESS TAG AND METHOD OF PRODUCING WIRELESS TAG

CROSS-REFERENCE TO RELATED APPLICATIONS

This application is based upon and claims the benefit of priority of the prior Japanese Patent Application No. 2009-183025, filed on Aug. 6, 2009, the entire contents of which are incorporated herein by reference.

FIELD

The embodiment discussed herein is related to a wireless tag and a method of producing the wireless tag that receives and transmits signals through wireless communication.

BACKGROUND

A wireless tag, including an RFID tag that stores individual information about products, people's IDs and the like and reads and writes the individual information through wireless communication of an automatic recognition system such as RFID, has been widely known. On the wireless tag, an IC chip that stores the individual information therein is mounted; the wireless tag includes an inlet having a wiring pattern (an antenna pattern for wireless communication or the like) being connected to the IC chip. The wireless tag is attached to, or embedded in, products, people's clothing and the like and identified by the automatic recognition system. Therefore, it is possible to collectively manage the flow of products, the entering or leaving of people and the like.

As a conventional technology, the technology of the wireless tag is disclosed as follows.

[Patent Document 1] Japanese Laid-open Patent Publication No. 2008-009537

In recent years, the wireless tag has been increasingly attached to objects that often apply a bending stress on the inlet, including peoples' clothing. Under such a usage situation, an excessive bending stress can be applied on a portion of the inlet; at the position where the inlet is bent, the inlet may be bent beyond necessity and result in the breaking of the wiring pattern on the inlet.

SUMMARY

According to an aspect of the invention, a wireless tag includes a base member that is flexible and on a surface of which a wiring pattern is formed, a wireless circuit chip that is mounted on the base member and connected to the wiring pattern, protective members that cover the base member and the wireless circuit chip and are lower in hardness than the base member, and a plurality of spherical projections that are arranged on the surfaces of the protective members, higher in hardness than the base member, and so arranged as to interfere with other adjacent spherical projections when at least the protective members are bent beyond a predetermined angle.

According to another aspect of the invention, a method of producing a wireless tag includes bonding, to one surface of a resilient first sheet, a second sheet that is higher in hardness than the first sheet, forming the second sheet that is bonded to the first sheet into a plurality of projections that interfere with other adjacent projections when at least the first sheet is bent beyond a predetermined angle, enclosing a base member which has the wiring pattern on a surface thereof and where a wireless circuit chip connected to the wiring pattern is mounted between facing sides of two first sheets, on the opposite sides of which second sheets are bonded, and bonding the two first sheets between which the wireless circuit chip is enclosed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of the present invention will be described with reference to the accompanying drawings.

Figure 1:
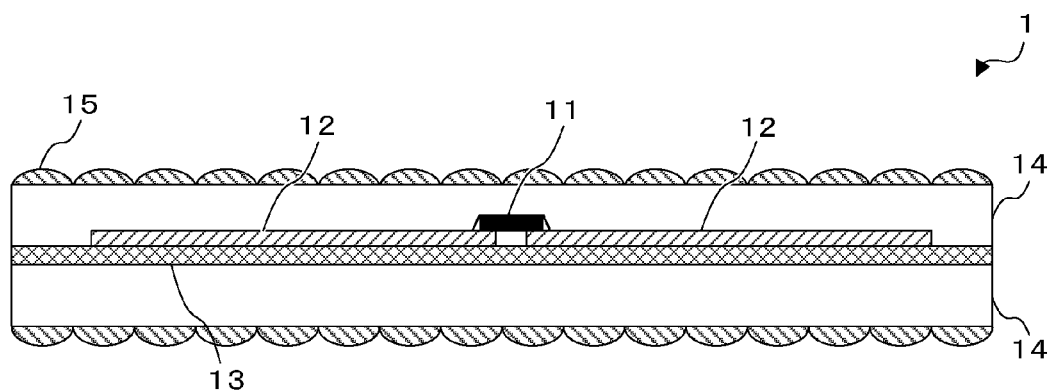
FIG. 1 is a cross-sectional view illustrating the configuration of a wireless tag according to an embodiment.

FIG. 1 is a cross-sectional view illustrating the configuration of a wireless tag according to an embodiment. As illustrated in FIG. 1, in a wireless tag 1, an inlet sheet consisting of a base sheet 13, an antenna pattern 12 that is one kind of wiring pattern formed on the base sheet 13, and a circuit chip 11 that is connected to the antenna pattern 12 and mounted on the base sheet 13 is sandwiched between protective members 14. The circuit chip 11 is an IC chip that is electrically connected to the antenna pattern 12 used for wireless communication. The circuit chip 11 reads and writes data on the basis of signals received by the antenna pattern 12. The base sheet 13 is made of a flexible material such as PET (Polyethylene Terephthalate). The protective members 14 are elastic bodies such as flexible rubber or elastomer. According to the present embodiment, the protective members 14 are made of flexible rubber with rubber hardness of about 40.

On the protective members 14, a plurality of spherical projections 15 are provided side-by-side so as to meet a projection installation condition described below. The projections 15 are higher in hardness than the protective members 14. If the protective members 14 are made of rubber with rubber hardness of 40, it is desirable that the projections 15 be made of rubber or elastomer with rubber hardness of about 80. The projections 15 are not limited to rubber. The projections 15 may be made of plastics, metal or the like. Spherical members, such as plastic balls, may be embedded in the surfaces of the protective members 14 to allow the spherical members to serve as the projections 15. According to the present embodiment, the projections 15 are made of rubber with rubber hardness of about 80. The projections 15 are not limited to spherical surfaces. The projections 15 may be formed in the shape of a round or square column or the like so as to project.

Figure 2:
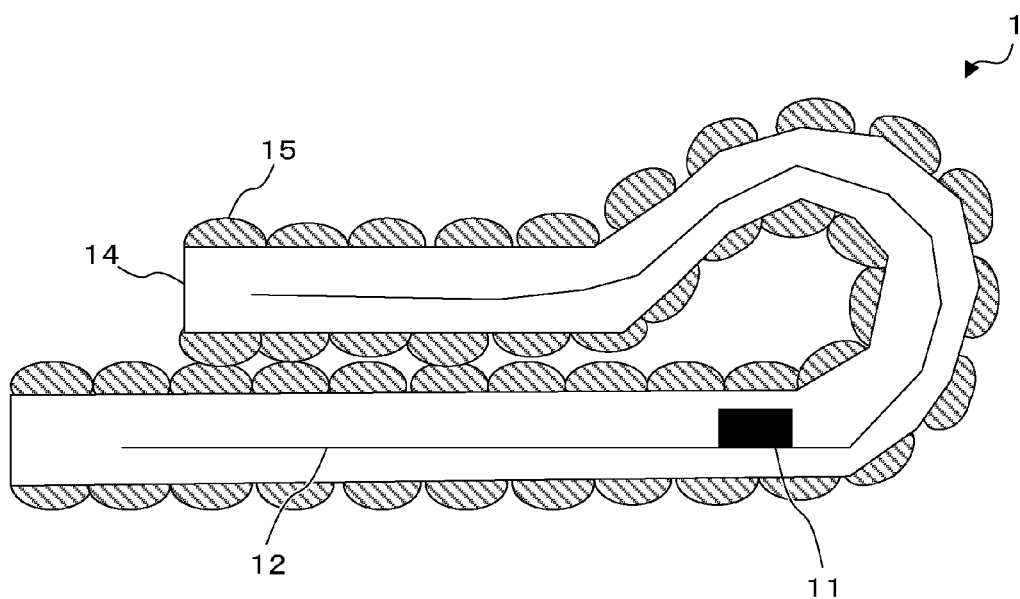
FIG. 2 is a diagram for explaining the wireless tag on which an excessive bending stress is applied, according to an embodiment.

In the wireless tag 1, on the protective members 14, a plurality of the projections 15 having a higher degree of rubber hardness than the protective members 14 is so provided as to meet the projection installation condition. Therefore, as illustrated in FIG. 2, even if an excessive bending stress is applied on the wireless tag 1, the projections 15 come in contact with each other to keep the wireless tag 1 from being bent. Thus, it is possible for the wireless tag 1 to prevent the breaking of the antenna pattern 12. Incidentally, in FIG. 2, the base sheet 13 is omitted for simplicity of explanation.

Figure 3:
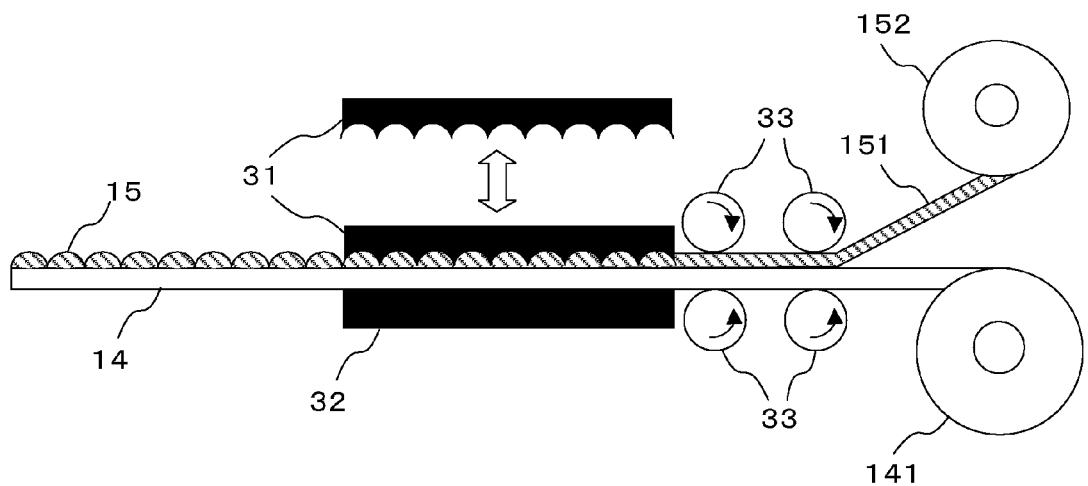
FIG. 3 is a diagram for explaining a process of producing protective members having projections, according to an embodiment.

A process of producing the wireless tag 1 will be described with reference to FIGS. 3 to 4. FIG. 3 is a diagram for explaining a process of producing the protective members having the projections, according to an embodiment. The reference numeral 151 in FIG. 3 denotes a projection material in the form of a sheet on which the projections 15 have not yet been formed. The reference numeral 152 denotes a spool on which the projection material 151 is wound. The reference numeral 141 denotes a spool on which the protective member 14 is wound. The reference numerals 31 and 32 denote dies that are used to form the projections 15 on the projection material 151 through press working. The reference numeral 31 represents the upper die, and the reference numeral 32 the lower die. The upper die 31 is processed so as to be able to form the projections 15 on the projection material 151. The upper die 31 is driven upward and downward by a driving device (not illustrated in the diagrams). The reference numeral 33 denotes a plurality of rotatable rollers that are put above and below the projection material 151 and the protective member 14 as if to hold the projection material 151 and the protective member 14 therebetween.

First, in a two-sheet compression bonding process, the projection material 151 and the protective member 14 are pulled out from the spools 152 and 141, respectively, and then put together and sandwiched between the rollers 33. After being sandwiched, the projection material 151 and the protective member 14 are compressed by the rollers 33 and heated by a heating device (not illustrated in the diagrams) at the same time. In this manner, the projection material 151 and the protective member 14 are compressed and thermally bonded together before being carried to a projection formation process. In this case, the heating temperature is appropriately set according to the characteristics of the materials of the projection material 151 and protective member 14. In the projection formation process, the projection material 151 is pressed by the upper die 31 and the lower die 32 to form the projections 15. Thanks to a series of processes described above, the protective member 14 having the projections 15 is formed.

Incidentally, according to the present embodiment, the projection material 151 and the protective member 14 are put together by the rollers 33 and heated at the same time; the projection material 151 and the protective member 14 are therefore compressed and thermally bonded together. Instead, the projection material 151 and the protective member 14 may be compressed and thermally bonded together only with the heated rollers 33. Moreover, the projection material 151 and the protective member 14 are compressed and thermally bonded together. However, the way to bond the projection material 151 and the protective member 14 together is not limited to thermocompression bonding. The projection material 151 and the protective member 14 may be bonded together with an adhesive or the like. Moreover, the projections 15 are formed after the projection material 151 and the protective member 14 are compressed and thermally bonded together. However, the way to form the projections 15 is not limited to the above method. Other methods, including the following methods, can be applied: a method by which the separately formed projections 15 are attached to, or compressed and thermally bonded to, the protective member 14, and a method of forming the projections 15 on the protective member 14 depending on the material of the projections 15.

The following describes a method by which the inlet sheet is sandwiched between the protective members 14 that are produced by the above method by which the projection materials 151 and the protective members 14 are compressed and bonded together and the projections 15 are then formed.

Figure 4:
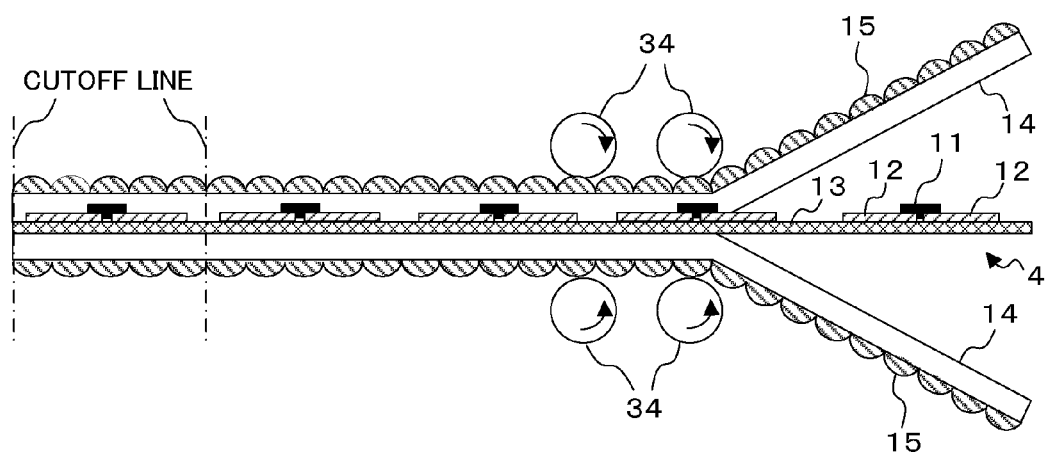
FIG. 4 is a diagram illustrating a process by which an inlet sheet is sandwiched between protective members, according to an embodiment.

FIG. 4 is a diagram illustrating a method by which the inlet sheet is sandwiched between the protective members, according to an embodiment. The reference numeral 4 in FIG. 4 denotes the inlet sheet. The reference numeral 34 represents a plurality of rotatable rollers that are put above and below the protective members 14 and the inlet sheet 4 as if to hold the protective members 14 and the inlet sheet 4 therebetween. First, in a three-sheet compression bonding process, the inlet sheet 4 is sandwiched between two protective members 14 whose projections 15 are facing outward. Then, the inlet sheet 4, along with the protective members 14, is sandwiched between the rollers 34. Since the inlet sheet 4 is sandwiched between the protective members 14, the circuit chips 11 and the antenna patterns 12 are enclosed between the protective members 14. That is, the inlet sheet 4 is enclosed between the facing sides of the two protective members 14, on the opposite sides of which the projection materials 151 are bonded through compression. After being sandwiched, the inlet sheet 4 and the protective members 14 are compressed by the rollers 34 and heated by a heating device (not illustrated in the diagrams) at the same time. In this manner, the inlet sheet 4 and the protective members 14 are compressed and thermally bonded together before being carried to a cutting process. After being compressed and thermally bonded together, the inlet sheet 4 and the protective members 14 are cut at predetermined intervals. As a result, the wireless tags 1 are produced. According to the present embodiment, the inlet sheet 4 and the protective members 14 are cut along a cutoff line as illustrated in FIG. 4. The intervals are appropriately set depending on the wiring structure of the antenna pattern 12, the usage of the wireless tag 1, the materials of components, and the like. However, it is desirable to set the intervals in a way that enables the inlet sheet 4 and the protective members 14 to be cut between the antenna patterns 12.

Incidentally, according to the present embodiment, the inlet sheet 4 is sandwiched between the protective members 14 having the projections 15. However, the way to provide the projections 15 is not limited to the above method. The projections 15 may be provided after the inlet sheet 4 is sandwiched between the protective members 14. Moreover, the inlet sheet 4 and the protective members 14 are compressed and thermally bonded together. However, the way to bond the inlet sheet 4 and the protective members 14 together is not limited to thermocompression bonding. The inlet sheet 4 and the protective members 14 may be bonded together with an adhesive or the like. Moreover, the projections 15 are continuously provided across one side of the protective member 14. Instead, the projections 15 may be provided only within an area of the protective member 14 that covers the antenna pattern 12 and the circuit chip 11.

Figure 5:
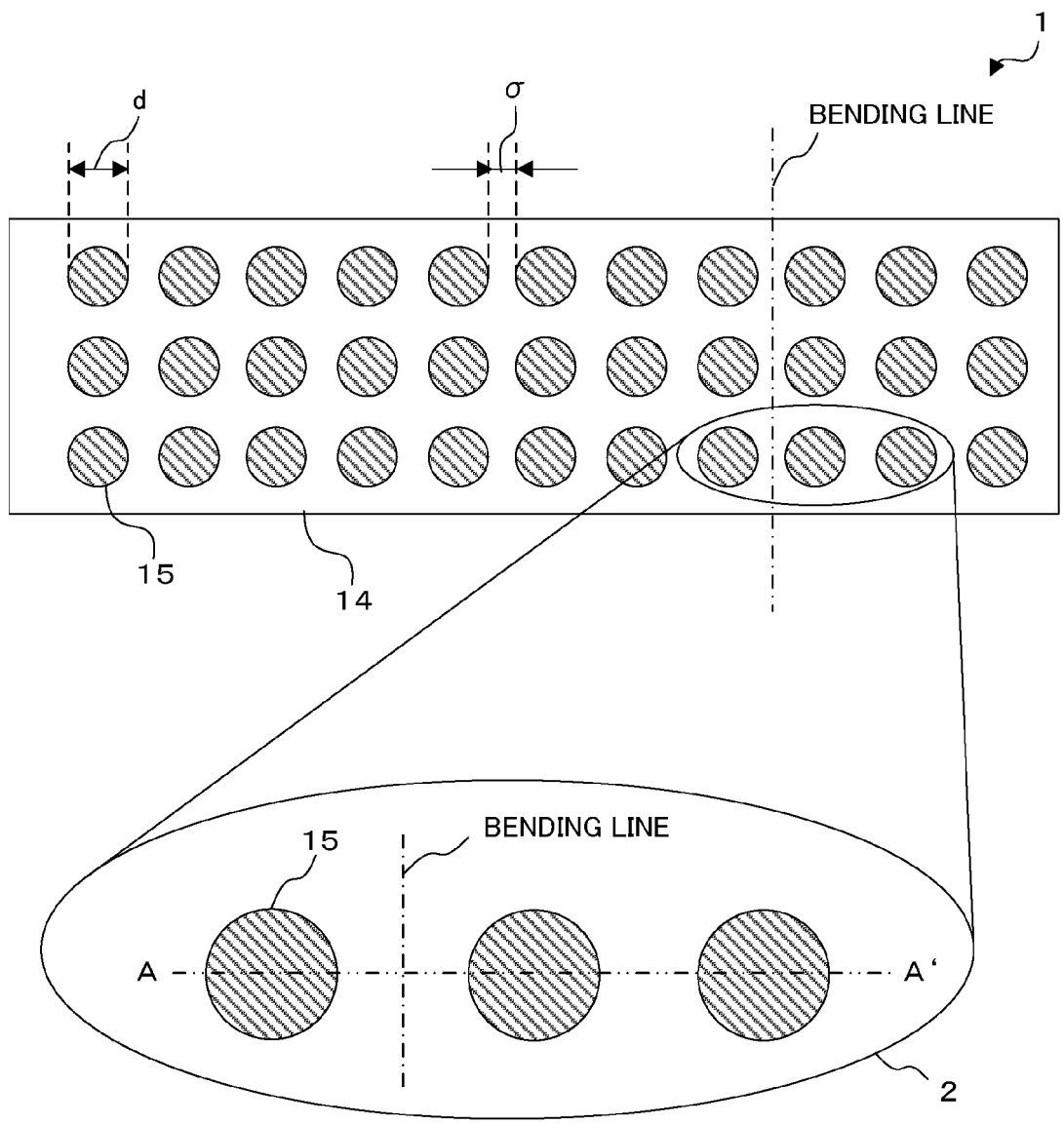
FIG. 5 is a view of the wireless tag seen from above, according to an embodiment.
Figure 6:
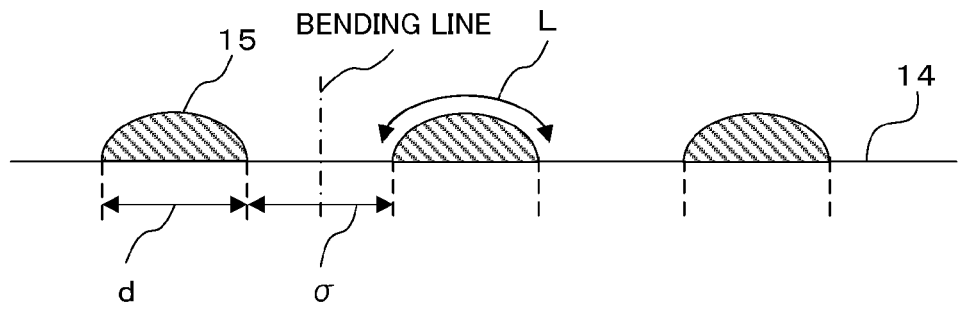
FIG. 6 is a cross-sectional view of the wireless tag taken along line VI-VI of FIG. 5, according to an embodiment.

The following describes the projection installation condition. The projection installation condition is a condition under which the projections 15 come in contact with each other when an excessive bending stress is applied on the wireless tag 1. The following provides a detailed description of the projection installation condition with reference to FIGS. 5 to 9. FIG. 5 is a view of the wireless tag seen from above, according to an embodiment. Incidentally, for reasons of convenience in describing the projection installation condition, the distance between the projections 15 is set longer on the wireless tag 1 in FIG. 5. In FIG. 5, the reference numeral 2 denotes an enlarged view of the projections 15 and the surrounding area. The width (i.e. the diameter of the projections 15) of the projections 15 in the direction perpendicular to a bending line is represented by d. In other words, the width of the projections 15 in the direction of the line connecting the two adjacent projections 15 is represented by d, The distance between the projections 15 in the direction perpendicular to the bending line is represented by σ. In other words, the distance between the two adjacent projections 15 is represented by σ. FIG. 6 is a cross-sectional view of the wireless tag taken along line VI-VI of FIG. 5, according to an embodiment. In FIG. 6, the peripheral length of the projections 15 in the direction perpendicular to the bending line is represented by L. In other words, the peripheral length of the projection 15 in the direction of the line connecting the two adjacent projections 15 is represented by L.

Figure 7:
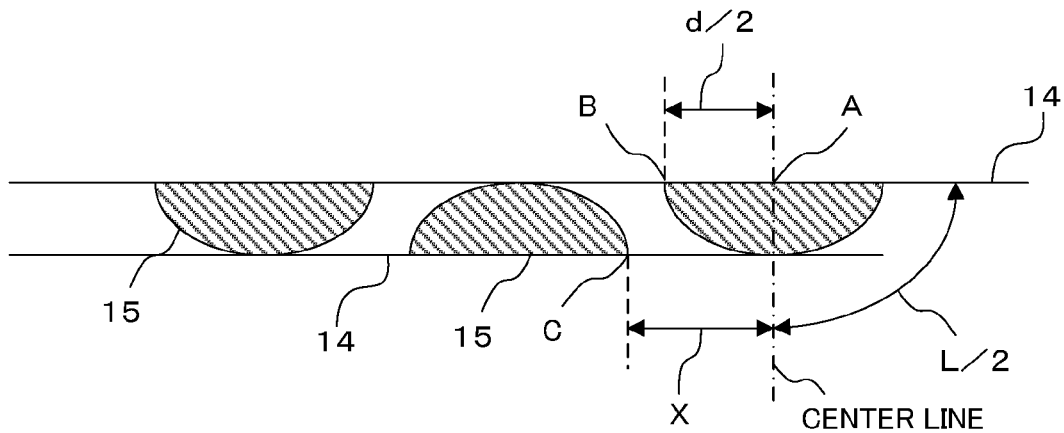
FIG. 7 is a diagram for explaining the wireless tag bent along a bending line, according to an embodiment.

FIG. 7 is a diagram for explaining the wireless tag bent along a bending line, according to an embodiment. In FIG. 7, the distance from a center line (the line that extends from the center A of the projection 15 and is perpendicular to the protective members 14) to the end B of the projection 15 is represented by d/2 (i.e. the radius of the projection 15). The distance from the center line to the end C of the adjacent projection 15 is represented by X. The peripheral length of the projection 15 in an area between the center line and the protective member 14 is represented by L/2. When the wireless tag 1 is bent along the bending line, the geometric relationship of the projections 15 is given by the following formula.

$$\sigma = X + (L/2) \quad (1)$$

Figure 8:
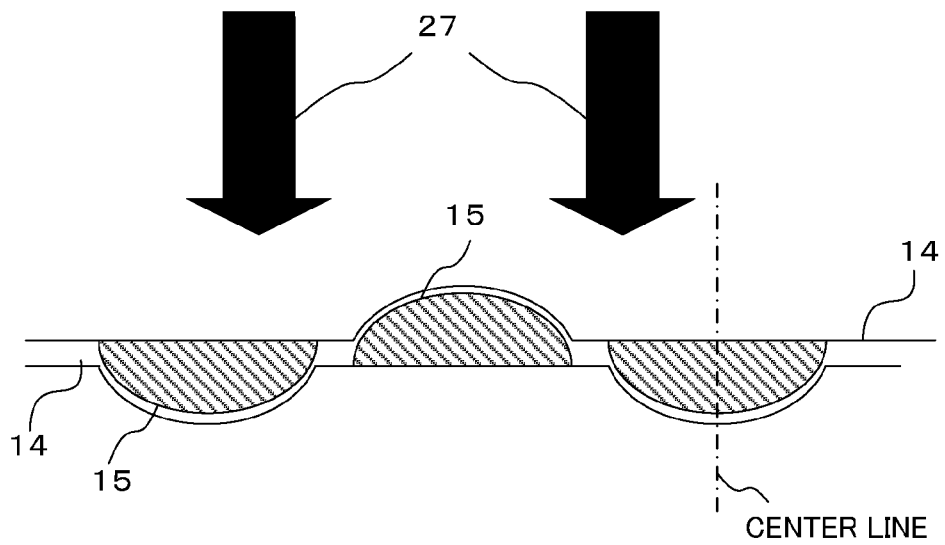
FIG. 8 is a diagram for explaining the case in which a bending stress is applied when the arrangement of projections of the wireless tag satisfies $X \geq d/2$, according to an embodiment.
Figure 9:
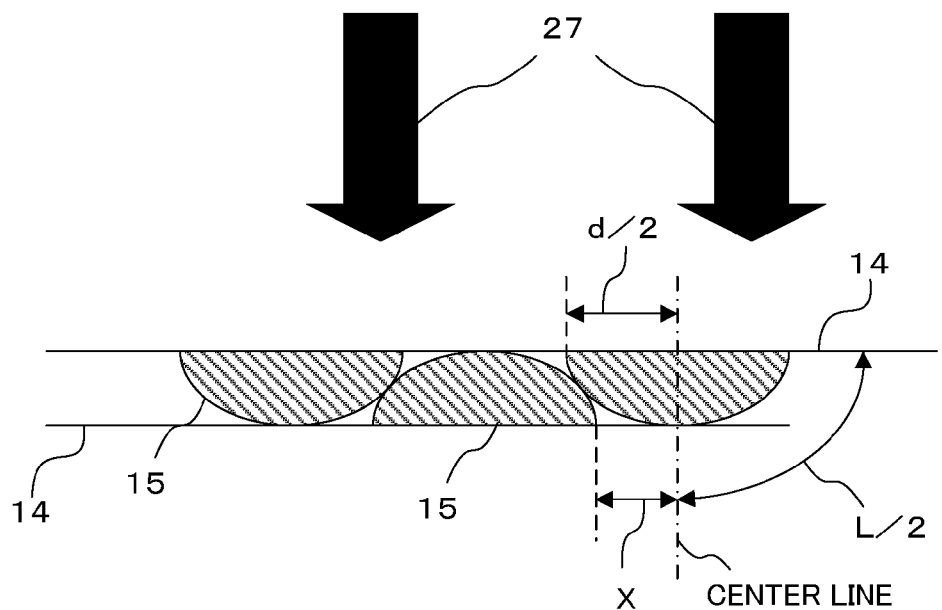
FIG. 9 is a diagram for explaining the case in which a bending stress is applied when the arrangement of the projections of the wireless tag satisfies $X < d/2$, according to an embodiment.

If $X \geq d/2$, the projections 15 do not come in contact with each other even if a further bending stress 27 is applied on the wireless tag 1 as illustrated in FIG. 8. Since the projections 15 do not come in contact with each other, the projections 15 are pressed into the protective member 14. Therefore, it is impossible to have the effect of suppressing the excessive bending stress. If $X<d/2$, the projections 15 come in contact with each other when a further bending stress 27 is applied on the wireless tag 1 as illustrated in FIG. 9. Since the projections 15 come in contact with each other, it is possible to have the effect of suppressing the excessive bending stress. Accordingly, for the geometric relationship of the projections 15, the following formula is given based on the formula (1).

$$\sigma - (L/2) = X < d/2 \quad (2)$$

Therefore, the installation condition of the projections 15 needs to satisfy the following formula.

$$\sigma - (L/2) < d/2 \text{ or } \sigma < (d/2) + (L/2) \quad (3)$$

The formula (3) represents the projection installation condition that the projections 15 need to satisfy to suppress the excessive bending stress. Incidentally, the width represented by d may be the same value in all the projections 15. And, the distance represented by a may be the same value between all the projections 15. Further, the peripheral length represented by L may be the same value in all the projections 15.

Figure 10:
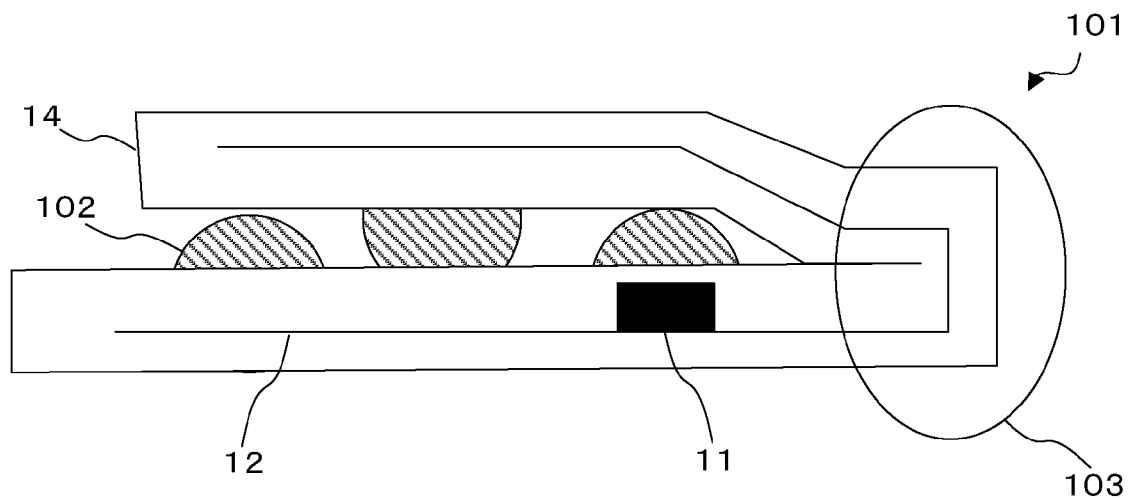
FIG. 10 is a diagram illustrating a wireless tag which is not adopting the embodiment with an excessive bending stress being applied thereon as a comparative example to the wireless tag of the embodiment.

FIG. 10 is a diagram illustrating a wireless tag which is not adopting the embodiment with an excessive bending stress being applied thereon as a comparative example to the wireless tag of the embodiment. In FIG. 10, the reference numeral 101 denotes a wireless tag which is not adopting the present embodiment. The reference numeral 102 denotes projections made of the same material that the protective members 14 are made of. The reference numeral 103 denotes a breaking point where the antenna pattern 12 is likely to break. As illustrated in FIG. 10, since the projections 102 do not meet the projection installation condition, the projections 102 do not come in contact with each other. Therefore, an excessive bending stress applied on the wireless tag 101 breaks the antenna pattern 12 at the breaking point 103.

Even if an excessive bending stress is applied at a bending position where the projections 102 come in contact with each other, the shape of the projections 102 can be easily changed by a bending force because the projections 102 are made of the same material that the protective members 14 are made of. Since the shape of the projections 102 can be easily changed, an excessive bending stress is applied on the wireless tag 101, resulting in the breaking of the antenna pattern 12 at the breaking point 103. If the protective members 14 and the projections 102 are both made of a hard material such as plastics, the protective members 14 break when an excessive bending stress is applied, leading to the breaking of the antenna pattern 12. Incidentally, in FIG. 10, the base sheet 13 is omitted for simplicity of explanation.

According to the present embodiment, even if an excessive bending stress is applied on the wireless tag 1, it is possible to suppress the wireless tag 1 from being bent because the protective members 14 bend flexibly and the projections 15 interfere with each other and come in contact with each other. Since it is possible to keep the wireless tag 1 from being bent, it is possible to prevent the breaking of the antenna pattern 12 as well as malfunctions of the circuit chip 11.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A wireless tag comprising:
a base member that is flexible and on a surface of which a wiring pattern is formed;
a wireless circuit chip that is mounted on the base member and connected to the wiring pattern;
protective members that cover the base member and the wireless circuit chip and are lower in hardness than the base member; and
a plurality of spherical projections that are arranged on the surfaces of the protective members, higher in hardness than the base member, and so arranged as to interfere with other adjacent spherical projections when at least the protective members are bent beyond a predetermined angle, wherein when a distance between two adjacent spherical projections of the plurality of spherical projections is represented by σ, a peripheral length of a spherical projection of the two adjacent spherical projections in a direction of a line connecting the two adjacent spherical projections is represented by L, and a width of the spherical projection in the direction of the line is represented by d, the plurality of spherical projections are arranged at intervals satisfying an inequality σ<(d/2)+(L/2).

2. The wireless tag according to claim 1, wherein the spherical projection are each arranged so as to touch the adjacent spherical projections.

3. The wireless tag according to claim 1, wherein the wiring pattern is an antenna pattern.

4. The wireless tag according to claim 1, wherein the plurality of spherical projections are provided only in an area that covers the wiring pattern and the wireless circuit chip on the surfaces of the protective members.

5. The wireless tag according to claim 1, wherein the wireless circuit chip includes an IC chip that reads and writes data using an antenna section that receives and transmits signals.

6. The wireless tag according to claim 1, wherein the protective member is made of a material with rubber hardness of 40.

7. The wireless tag according to claim 1, wherein the spherical projections are made of a material with rubber hardness of 80.

8. A method of producing a wireless tag, comprising:
bonding, to one surface of a resilient first sheet, a second sheet that is higher in hardness than the first sheet;
forming the second sheet that is bonded to the first sheet into a plurality of projections that interfere with other adjacent projections when at least the first sheet is bent beyond a predetermined angle;
enclosing a base member which has a wiring pattern on a surface thereof and where a wireless circuit chip connected to the wiring pattern is mounted between facing sides of two first sheets, on the opposite sides of which second sheets are bonded; and
bonding the two first sheets between which the wireless circuit chip is enclosed, wherein
when the second sheet is formed into the plurality of projections and when the distance between a two adjacent projections of the plurality of projections is represented by σ, a peripheral length of a projection of the two adjacent projections in a direction of a line connecting the two adjacent projections is represented by L, and a width of the projection in the direction of the line is represented by d, the plurality of projections are formed at intervals satisfying an inequality σ<(d/2)+(L/2).

9. The method of producing the wireless tag according to claim 8, wherein,
when the second sheet is formed into the plurality of projections, the plurality of projections are formed into spherical projections.

10. The method of producing the wireless tag according to claim 9, wherein,
when the second sheet is formed into the plurality of projections, the second sheet is formed into the plurality of projections by compressing, with the use of dies that form the plurality of projections into a spherical shape, the second sheet that is bonded to the first sheet.

11. The method of producing the wireless tag according to claim 8, wherein,
when the second sheet is formed into the plurality of projections, the plurality of projections are formed only in an area that covers the wiring pattern and the wireless circuit chip on the second sheet.

12. The method of producing the wireless tag according to claim 8, wherein
the wireless circuit chip includes an IC chip that reads and writes data using an antenna section that receives and transmits signals.

13. The method of producing the wireless tag according to claim 8, wherein
the first sheet is made of a material with rubber hardness of 40.

14. The method of producing the wireless tag according to claim 8, wherein
the second sheet is made of a material with rubber hardness of 80.

15. The method of producing the wireless tag according to claim 8, wherein
the first and second sheets are bonded together through thermocompression bonding.

16. The method of producing the wireless tag according to claim 8, wherein
the two first sheets between which the wireless circuit chip is enclosed are bonded together through thermocompression bonding.

* * * * *